United States Patent
Venigalla et al.

(10) Patent No.: US 8,557,649 B2
(45) Date of Patent: Oct. 15, 2013

(54) METHOD FOR CONTROLLING STRUCTURE HEIGHT

(75) Inventors: Rajasekhar Venigalla, Hopewell Junction, NY (US); Michael Vincent Aquilino, Hopewell Junction, NY (US); Massud A. Aminpur, Hopewell Junction, NY (US); Michael P. Belyansky, Hopewell Junction, NY (US); Unoh Kwon, Hopewell Junction, NY (US); Christopher Duncan Sheraw, Hopewell Junction, NY (US); Daewon Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 13/278,301

(22) Filed: Oct. 21, 2011

(65) Prior Publication Data

US 2013/0102125 A1 Apr. 25, 2013

(51) Int. Cl.
*H01L 21/8238* (2006.01)

(52) U.S. Cl.
USPC ............. 438/199; 438/303; 257/E21.632

(58) Field of Classification Search
USPC .......... 438/197, 199, 230, 303; 257/E21.632
See application file for complete search history.

(56) References Cited

U.S. PATENT DOCUMENTS

| | | | |
|---|---|---|---|
| 5,607,718 A | 3/1997 | Sasaki et al. | |
| 5,928,960 A | 7/1999 | Greco et al. | |
| 6,103,625 A | 8/2000 | Marcyk et al. | |
| 6,541,397 B1 | 4/2003 | Bencher | |
| 6,653,202 B1 | 11/2003 | Fisher et al. | |
| 7,402,498 B2 | 7/2008 | Derderian et al. | |
| 7,576,009 B2 | 8/2009 | Lee et al. | |
| 7,718,081 B2 | 5/2010 | Liu et al. | |
| 7,799,630 B2 * | 9/2010 | Yu et al. | 438/230 |
| 2009/0315096 A1 | 12/2009 | Wei et al. | |
| 2010/0289064 A1 | 11/2010 | Or-Bach et al. | |

FOREIGN PATENT DOCUMENTS

GB 2275129 A 8/1994

* cited by examiner

*Primary Examiner* — Hoai V Pham
(74) *Attorney, Agent, or Firm* — Howard M. Cohn; Ian D. MacKinnon

(57) ABSTRACT

Methods for controlling the height of semiconductor structures are disclosed. Amorphous carbon is used as a stopping layer for controlling height variability. In one embodiment, the height of replacement metal gates for transistors is controlled. In another embodiment, the step height of a shallow trench isolation region is controlled.

5 Claims, 9 Drawing Sheets

METHOD FOR CONTROLLING STRUCTURE HEIGHT

FIELD OF THE INVENTION

The present invention relates to semiconductor fabrication, and more particularly, to methods for controlling the variability of the height of various semiconductor structures.

BACKGROUND OF THE INVENTION

Increased density and proximity of both active and passive electronic device structures in an integrated circuit have been recognized to provide benefits in both performance and functionality of integrated circuits. For example, reduced lengths of signal propagation paths allow operation at higher clock rates while reducing susceptibility to noise. Increased numbers of devices on a single chip also generally support such improved performance while allowing a greater number and variety of circuit functions to be provided such as local voltage regulation and conversion, local memory and additional logic circuitry or coprocessors for microprocessors, non-volatile storage, redundant circuitry, self-test arrangements and many other types and combinations of circuits.

However, such increases in integration density and performance require improved control of various device parameters. One such parameter is the step height, which is the difference in height between the tops of two layers within a semiconductor structure. A consistent step height is important for repeatability and consistency amongst various manufactured samples of a particular type of semiconductor device.

SUMMARY

In one embodiment, a method of forming a replacement metal transistor gate is disclosed. The method comprises depositing a layer of amorphous carbon on a sacrificial gate disposed at a location on a semiconductor structure, depositing an oxide layer on the amorphous carbon layer, depositing a nitride layer on the oxide layer, planarizing the semiconductor structure to expose the layer of amorphous carbon, removing the amorphous carbon, removing the sacrificial gate and forming a metal gate in the location previously occupied by the sacrificial gate.

In another embodiment, a method of forming a replacement metal transistor gate is disclosed. The method comprises forming a sacrificial gate comprised of amorphous carbon at a location on a semiconductor structure, depositing an oxide layer on the amorphous carbon sacrificial gate, depositing a nitride layer on the oxide layer, planarizing the semiconductor structure to expose the amorphous carbon sacrificial gate, removing the amorphous carbon sacrificial gate, and forming a metal gate in the area previously occupied by the amorphous carbon sacrificial gate.

In another embodiment, a method of forming a shallow trench isolation region in a semiconductor structure is disclosed. The method comprises depositing a first oxide layer on a silicon substrate, depositing a first nitride layer on the first oxide layer; depositing an amorphous carbon layer on the first nitride layer, depositing a second nitride layer on the amorphous carbon layer, depositing a second oxide layer on the nitride layer, depositing a photoresist layer on the second oxide layer, forming an opening that extends from the top of the photoresist layer into the silicon substrate, filling the opening with an STI oxide, and planarizing the semiconductor structure to the level of the top of the amorphous carbon layer.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a prior art semiconductor structure for replacement metal gate transistors.

FIG. 2 shows a semiconductor structure used for fabrication of replacement metal gate transistors in accordance with an embodiment of the present invention.

FIG. 3 shows a semiconductor structure used for fabrication of replacement metal gate transistors in accordance with an alternative embodiment of the present invention.

FIG. 4 shows an embodiment of the present invention after planarization.

FIG. 4A shows replacement metal gates fabricated by a method in accordance with an embodiment of the present invention.

FIG. 5 shows a semiconductor structure at a starting point for another embodiment of the present invention.

FIG. 6 shows a semiconductor structure similar to that of FIG. 5, after a lithographic patterning step.

FIG. 7 shows a semiconductor structure similar to that of FIG. 6, after a first anisotropic etch.

FIG. 8 shows a semiconductor structure similar to that of FIG. 7, after depositing protective nitride spacers.

FIG. 9 shows a semiconductor structure similar to that of FIG. 8, after a second anisotropic etch.

FIG. 10 shows a semiconductor structure similar to that of FIG. 9, after depositing an oxide liner.

Figure 10:
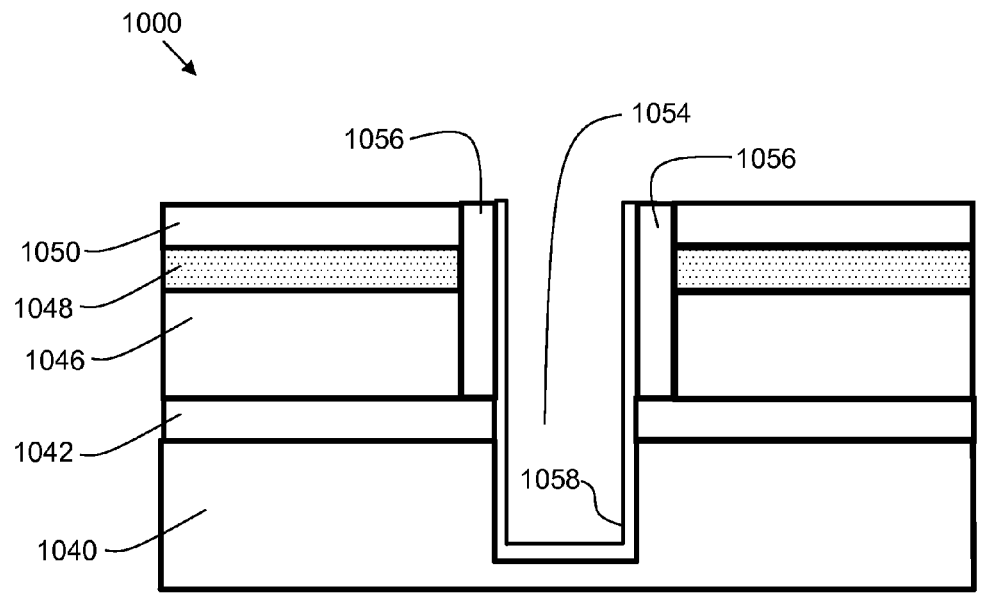
Figure 11:
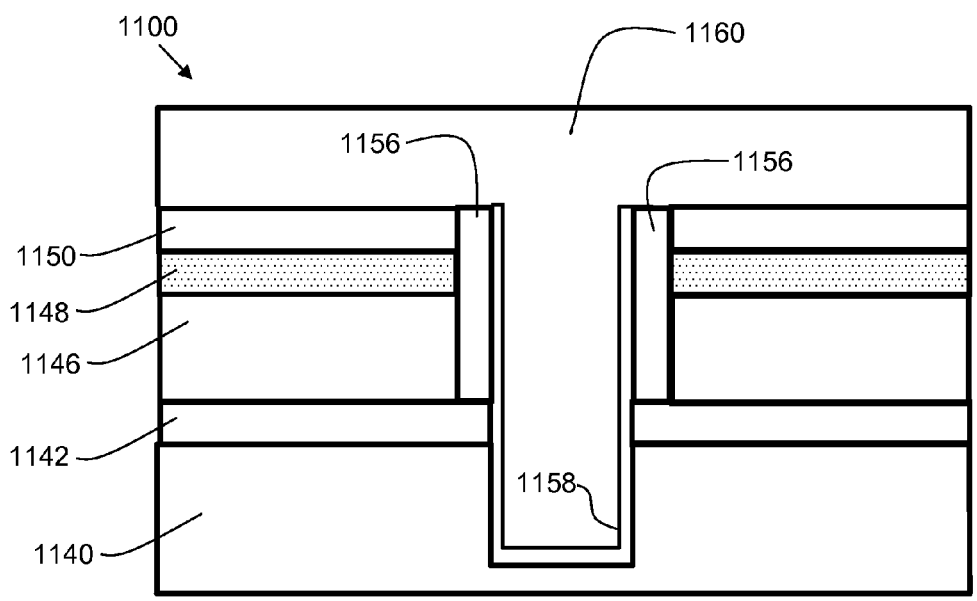

FIG. 11 shows a semiconductor structure similar to that of FIG. 10, after depositing a shallow trench isolation (STI) oxide.

Figure 12:
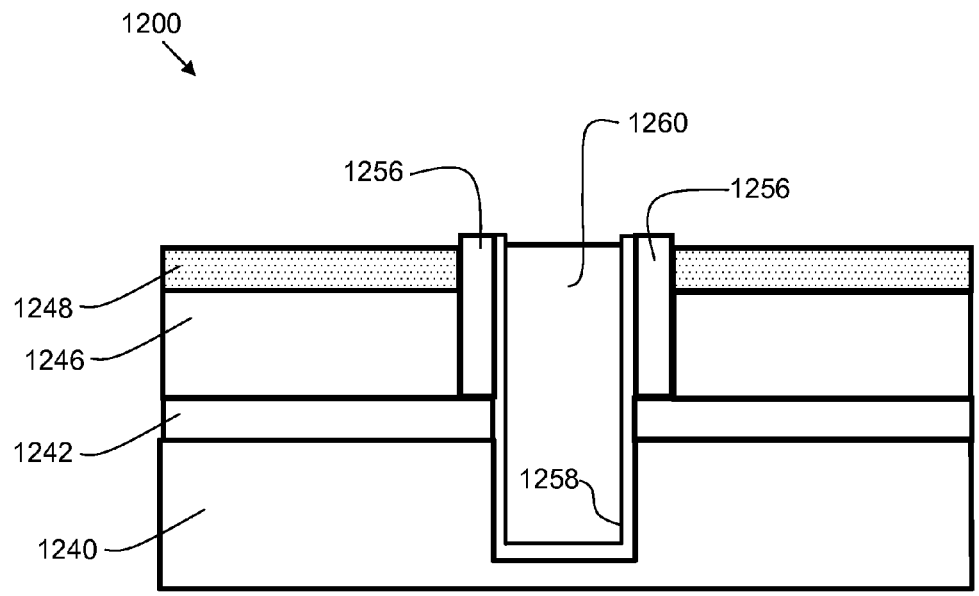

FIG. 12 shows a semiconductor structure similar to that of FIG. 11, after a planarization step.

Figure 13:
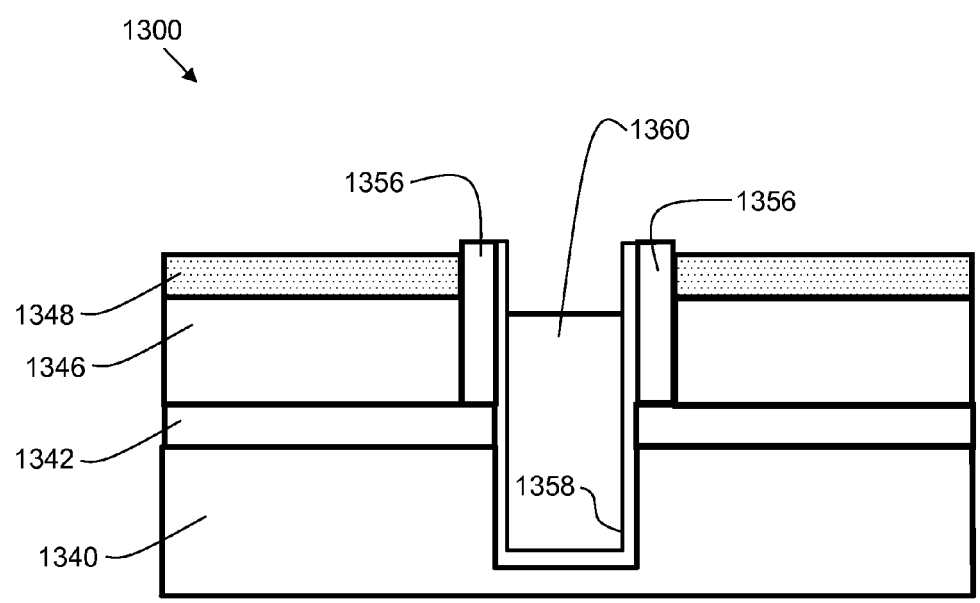

FIG. 13 shows a semiconductor structure similar to that of FIG. 12, after a BHF deglaze step.

Figure 14:
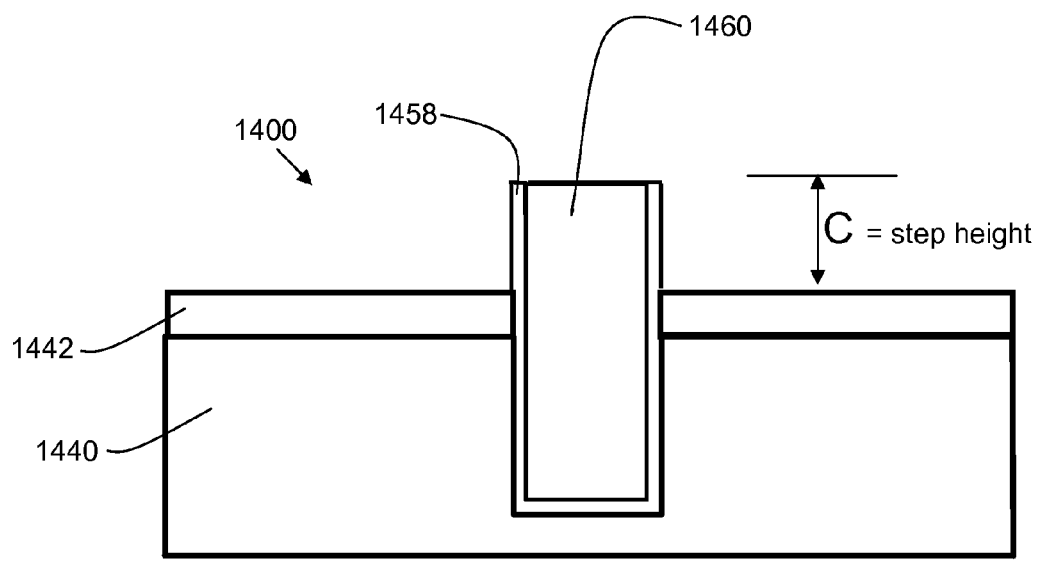

FIG. 14 shows a semiconductor structure similar to that of FIG. 13, after removal of sacrificial layers.

Figure 15:
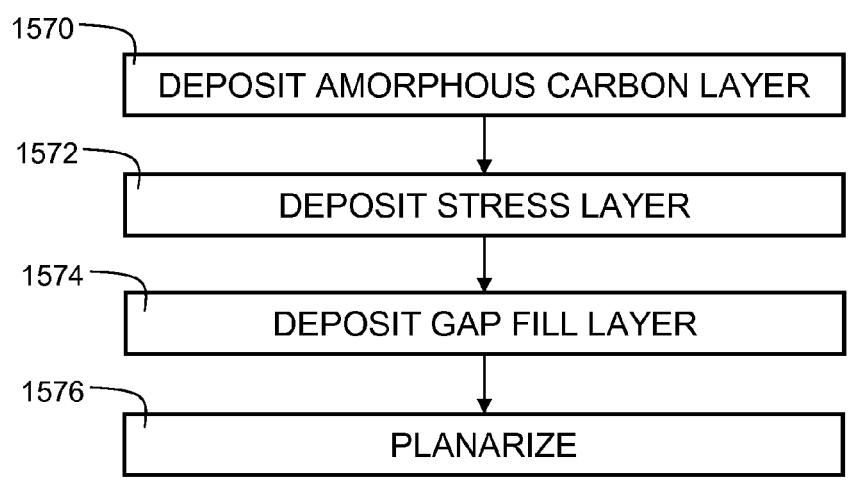

FIG. 15 is a flowchart for an embodiment of the present invention.

Figure 16:
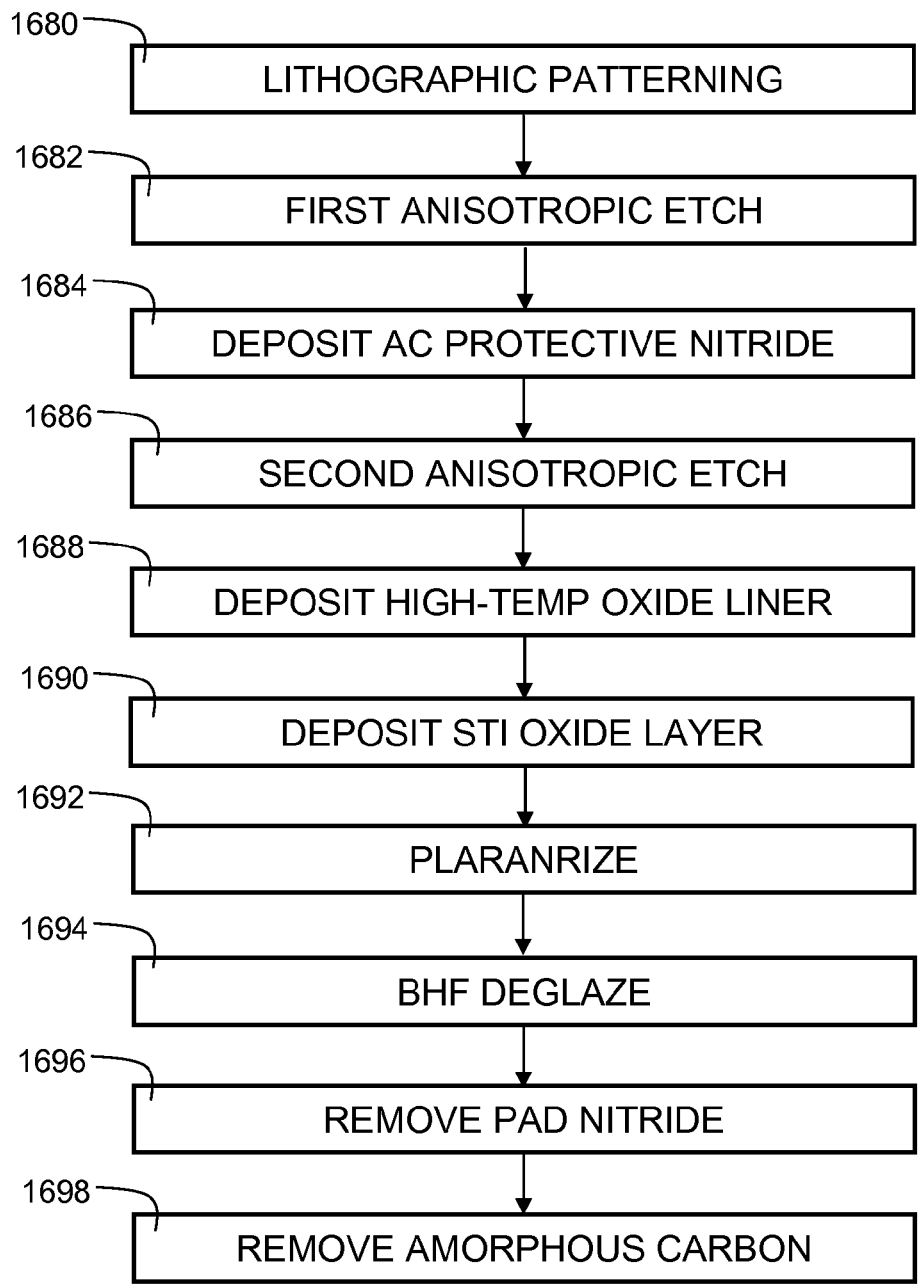

FIG. 16 is a flowchart for another embodiment of the present invention.

DETAILED DESCRIPTION

Figure 1:
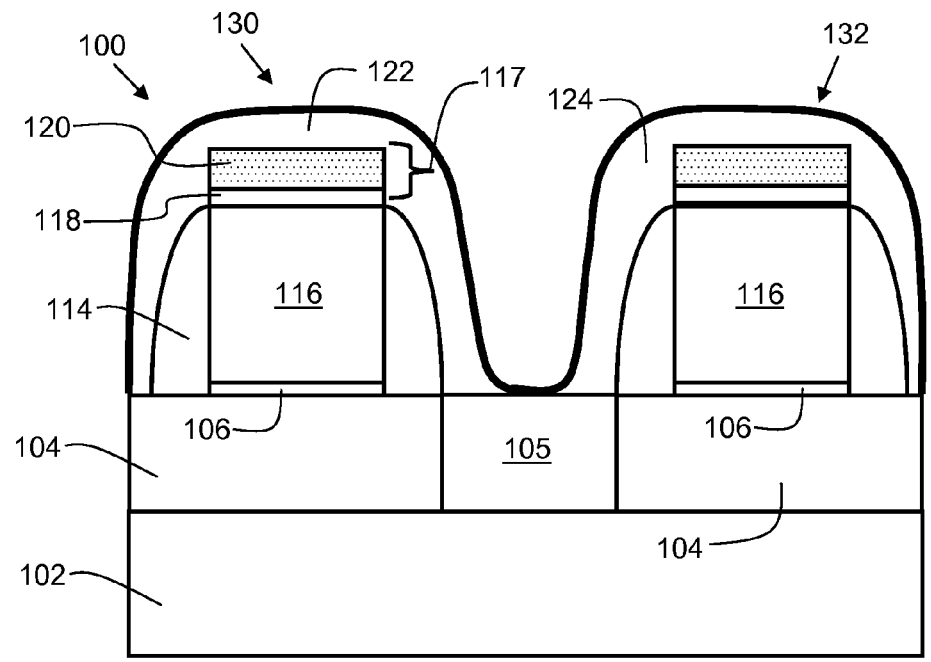

FIG. 1 shows a prior art semiconductor structure 100 for replacement metal gate transistors. Prior art semiconductor structure 100 comprises buried oxide (BOX) layer 102. Disposed on BOX layer 102 is a silicon layer 104. An NFET transistor 130 and PFET transistor 132 are formed on the silicon layer 104. A shallow trench isolation (STI) region 105 is disposed between the NFET transistor 130 and the PFET transistor 132. Each transistor is comprised of a gate 116 disposed on a gate oxide 106. Sidewall spacers 114 are formed adjacent to gate 116. A "PC cap stack" 117 comprised of two layers is disposed on gate 116. PC cap stack 117 comprises an oxide layer 118 and a nitride layer 120. Disposed over the NFET 130 is a stress layer 122. Stress layer 122 is a nitride layer that induces mechanical stress on the NFET to improve electron mobility. Disposed over the PFET 132 is a stress nitride 124. Stress layer 124 induces mechanical stress on the PFET to improve hole mobility. The stress layer 124 is typically of a different material than the stress nitride 122, as the types of performance-increasing stresses differ for NFETs and PFETs.

Figure 2:
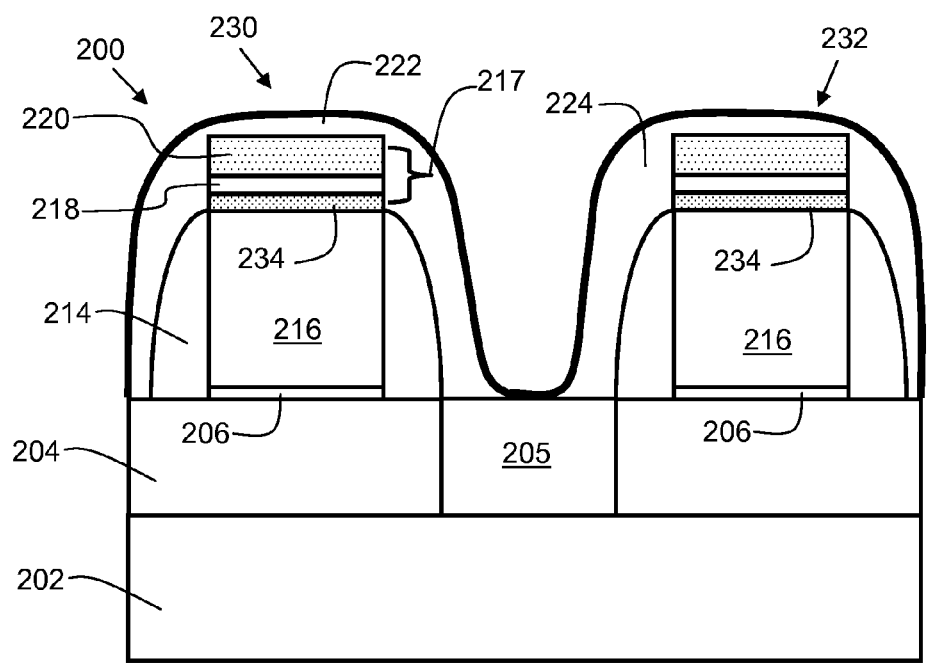

FIG. 2 shows a semiconductor structure 200 used for fabrication of replacement metal gate transistors in accordance with an embodiment of the present invention. In a replacement metal gate (RMG) process, the original gate material (e.g. polysilicon) is replaced with a metal (such as ruthenium or titanium, for example). As stated previously, often, similar elements may be referred to by similar numbers in various figures (FIGs) of the drawings, in which case typically the last two significant digits may be the same. For example, stress layer 222 of FIG. 2 is similar to stress layer 122 of FIG. 1.

A difference between semiconductor structure 200 of FIG. 2 and semiconductor structure 100 of FIG. 1 is the PC cap stack 217. Similar to PC cap stack 117 of FIG. 1, PC cap stack 217 comprises nitride layer 220 and oxide layer 218. However, PC cap stack 217 also comprises amorphous carbon (aC) layer 234 disposed on the sacrificial gate structure 216. Gate structure 216 may be comprised of polysilicon. In the finished FET, the gate structure 216 is replaced with a metal gate (not shown). The aC layer 234 functions as a stopping layer during subsequent planarization steps that are performed with one or more chemical mechanical polish (CMP) steps. In one embodiment, the aC layer 234 is deposited using chemical vapor deposition. In one embodiment, the aC layer 234 has a thickness ranging from about 100 angstroms to about 300 angstroms. In another embodiment, the thickness of aC layer 234 is about 200 angstroms.

Figure 3:
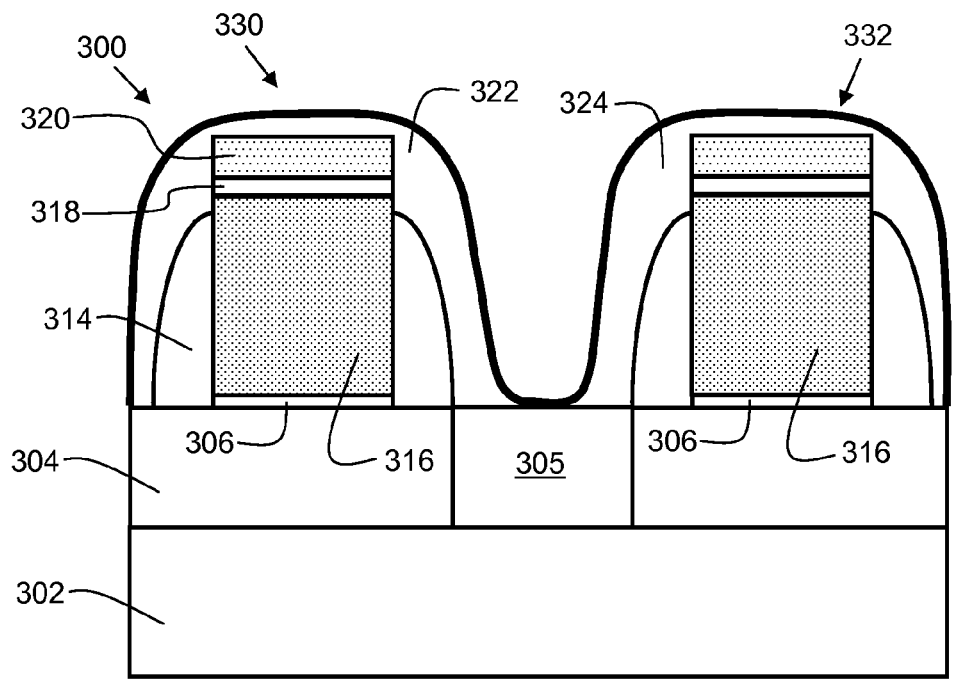

FIG. 3 shows a semiconductor structure 300 used for fabrication of replacement metal gate transistors in accordance with an alternative embodiment of the present invention. In this case, the entire sacrificial gate 316 is comprised of amorphous carbon. The amorphous carbon sacrificial gate 316 serves as a stopping layer. In the finished FET, the amorphous carbon sacrificial gate structure 316 is replaced with a metal gate (see FIG. 4A).

Figure 4:
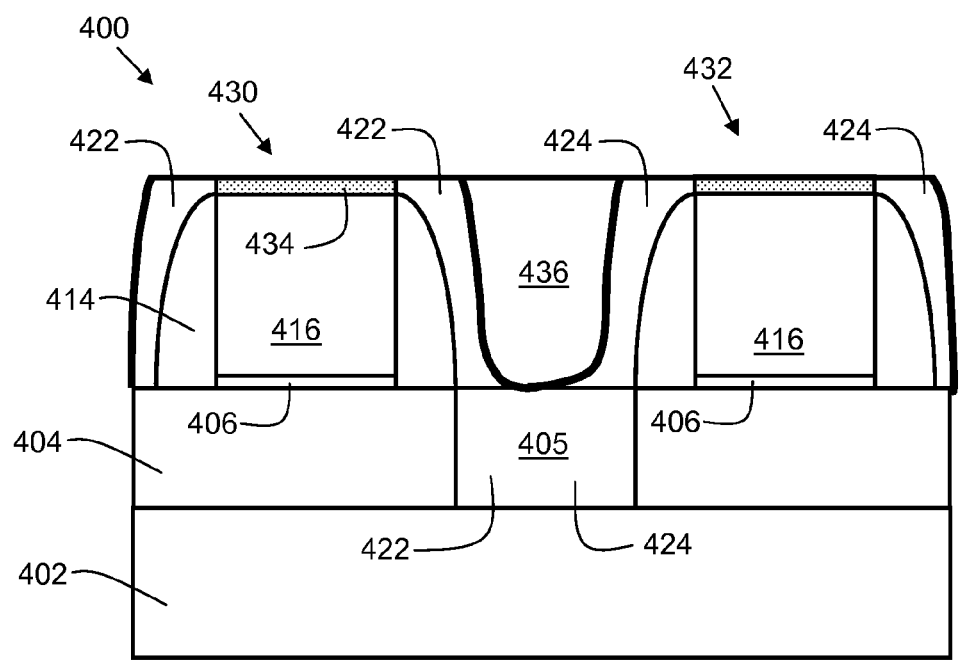

FIG. 4 shows an embodiment of the present invention after planarization. Semiconductor structure 400 represents semiconductor structure 200 (FIG. 2) after planarization. The planarization may be performed via a chemical mechanical polish (CMP) process. A combination of slurry polish processes and fixed abrasive polish processes may be used. The CMP process stops on the aC layer 434, preventing over-polishing of the semiconductor structure 400. Prior to the CMP process, gap fill layer 436 may be deposited to preserve other layers during subsequent processing steps. In one embodiment, gap fill layer 436 is comprised of a USG (undoped silicate glass) and TEOS (tetraethylorthosilicate) material. The aC layer 434 may be removed with an O2 plasma ash process. The standard replacement metal gate (RMG) processing steps may then follow.

Figure 4A:
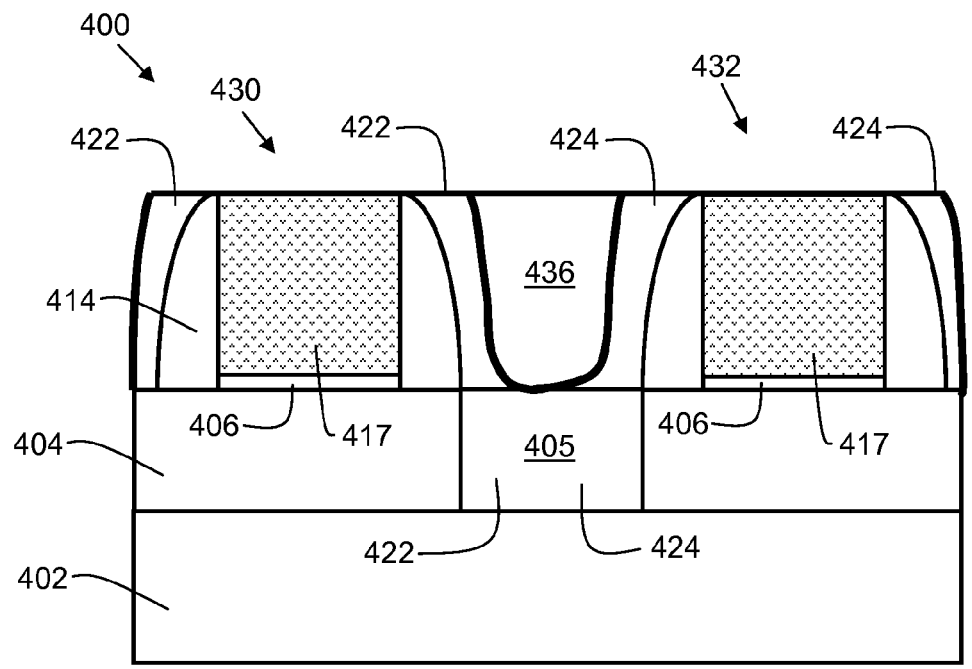

FIG. 4A shows replacement metal gates (RMG) 417 fabricated by a method in accordance with an embodiment of the present invention. The sacrificial gates (316 of FIG. 3) or (216 of FIG. 2) have been replaced with metal gates 417. Hence, the metal gates 417 are in the space previously occupied by sacrificial gates. The use of the amorphous carbon as an etch stop during the steps leading up to the RMG provide for a consistent planarization level, resulting in a consistent height for the metal gates 417 amongst devices on the semiconductor structure. This results in more repeatable device performance and improved product yield.

Figure 5:
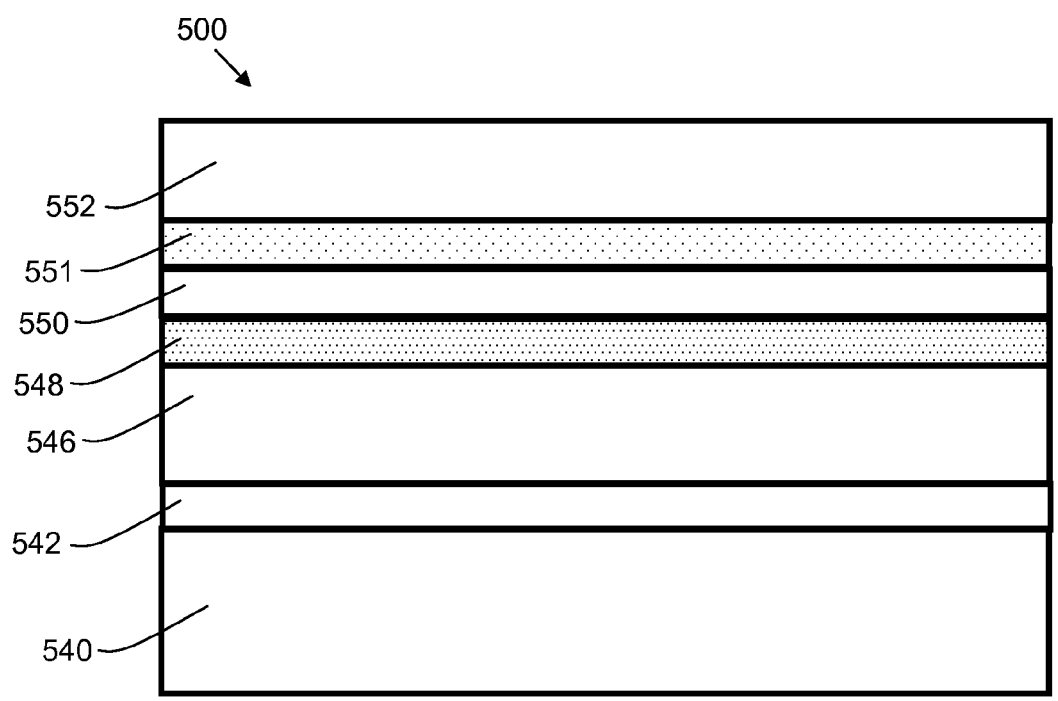

FIG. 5 shows a semiconductor structure 500 at a starting point for another embodiment of the present invention. Semiconductor structure 500 comprises silicon layer (substrate) 540. Disposed on silicon layer 540 is a first (pad) oxide layer 542. Disposed on pad oxide 542 is pad nitride 546. Disposed on pad nitride 546 is amorphous carbon (aC) layer 548. Disposed on aC layer 548 is a second nitride layer 550. Disposed on second nitride layer 550 is a second oxide layer 551. Disposed on second oxide layer 551 is photoresist layer 552.

Figure 6:
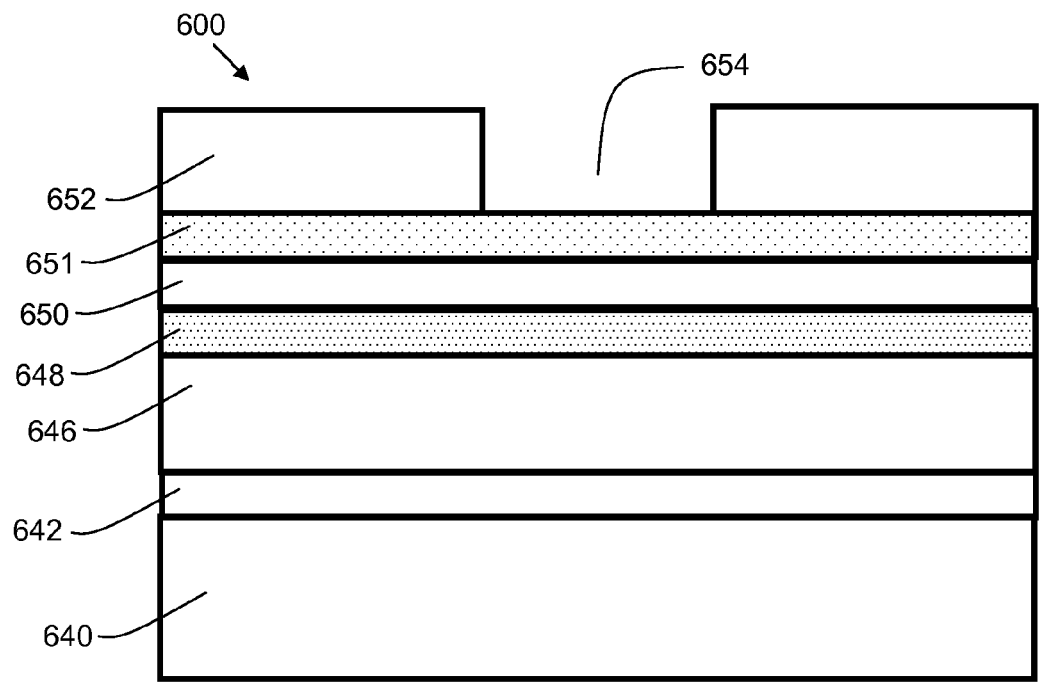

FIG. 6 shows a semiconductor structure 600 similar to that of FIG. 5, after a lithographic patterning step, which creates opening 654 in photoresist layer 652.

Figure 7:
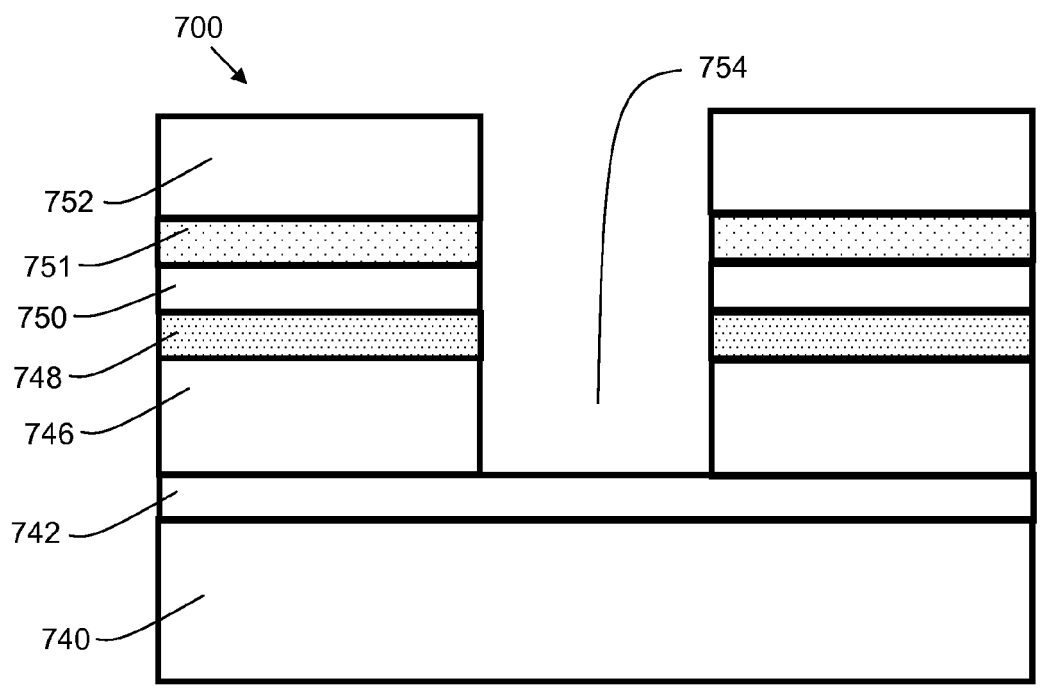

FIG. 7 shows a semiconductor structure 700 similar to that of FIG. 6, after a first anisotropic etch which creates opening 754 which stops on pad oxide layer 742.

Figure 8:
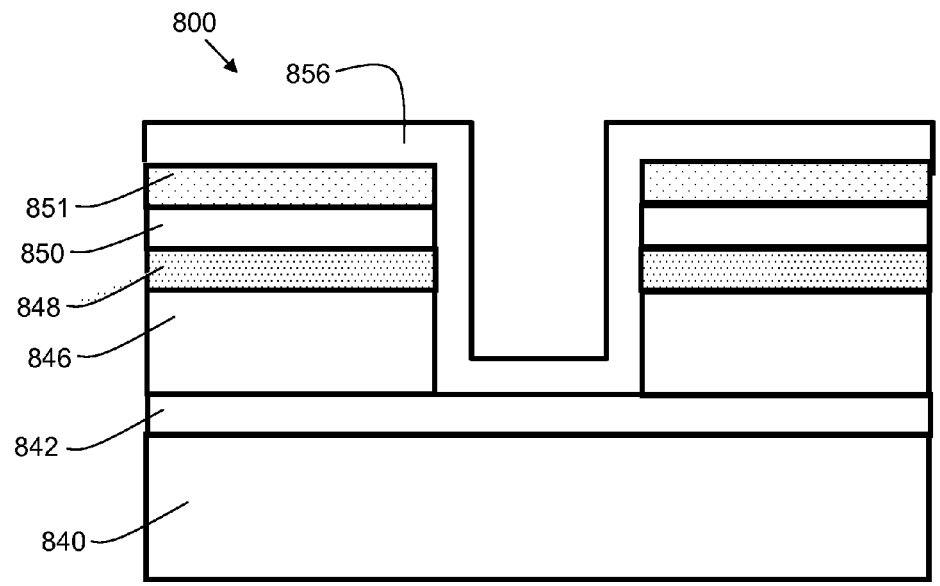

FIG. 8 shows a semiconductor structure 800 similar to that of FIG. 7, after removing the photoresist layer (compare with 752 of FIG. 7), and depositing a third (protective) nitride layer 856.

Figure 9:
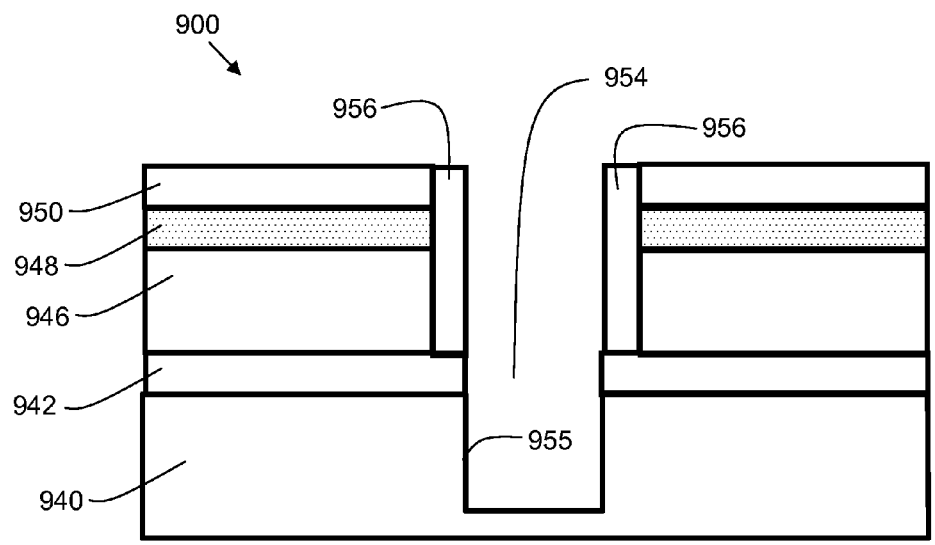

FIG. 9 shows a semiconductor structure 900 similar to that of FIG. 8, after a second anisotropic etch which extends opening 954 partially through the silicon layer 940, followed by planarization to remove the portion of the third nitride layer that is on the top surface of the semiconductor structure, as well as the second oxide layer (compare with 851 of FIG. 8). The opening 954 comprises interior surface 955. The remaining portion of the third nitride layer 956 serves as a "spacer" to protect the amorphous carbon layer 948. Without such protection, the amorphous carbon layer 948 could be damaged during subsequent processing, such as formation of an oxide liner on the interior surface 955.

FIG. 10 shows a semiconductor structure 1000 similar to that of FIG. 9, after forming an oxide liner 1058 on the interior surface (see 955 of FIG. 9) of opening 1054. The oxide liner 1058 may be a thermal oxide grown at a high temperature. The oxide liner serves to cover the silicon areas of the trench, which may have become damaged during trench formation.

FIG. 11 shows a semiconductor structure 1100 similar to that of FIG. 10, after depositing a shallow trench isolation (STI) oxide 1160. STI oxide 1160 fills the opening (see 1054 of FIG. 10) and is also disposed on the top of semiconductor structure 1100. The STI oxide 1160 may be a low temperature oxide.

FIG. 12 shows a semiconductor structure 1200 similar to that of FIG. 11, after a planarization step. The STI oxide 1260 is now only in the opening, and has been removed from the top surface of the semiconductor structure 1200. The planarization may be performed via one or more chemical mechanical polish (CMP) processes. In some embodiments, the CMP processes may be slurry-based, fixed abrasive, or a combination of both types. The planarization process utilizes aC layer 1248 as a stopping layer.

FIG. 13 shows a semiconductor structure 1300 similar to that of FIG. 12, after a BHF (buffered hydrofluoric acid) deglaze step. This recesses the STI oxide 1360 to the desired height for forming the STI regions that are disposed between adjacent semiconductor devices such as transistors.

FIG. 14 shows a semiconductor structure 1400 similar to that of FIG. 13, after removal of sacrificial layers. The aC layer (1348 of FIG. 13) may be removed with an O2 ash process. The removal of pad nitride layer (layer 1346 of FIG. 13) may be performed with any suitable nitride removal process, such as a wet etch. The step height, represented by arrow C, is of a consistent height throughout the fabrication run, resulting in reduced variability among fabricated devices, and improved semiconductor performance.

FIG. 15 is a flowchart for an embodiment of the present invention. In process step 1570, an amorphous carbon layer is deposited. This is shown as 234 in FIG. 2. In process step 1572 a stress layer is deposited. This is shown as 222 in FIG. 2. In process step 1574, a gap fill layer is deposited. This is shown as 436 in FIG. 4. In process step 1576, the semiconductor structure is planarized. This is shown with semiconductor structure 400 of FIG. 4. The planarization may be performed with a chemical mechanical polish (CMP). The CMP may be a fixed abrasive CMP or a slurry based CMP, or a combination of both types may be used.

FIG. 16 is a flowchart for another embodiment of the present invention. In process step 1680, lithographic patterning is performed. This is shown in FIG. 6 (see 654). In process step 1682, a first anisotropic etch is performed. This is shown in FIG. 7 (see 754). In process step 1684, a protective nitride layer is deposited over the amorphous carbon. This is shown in FIG. 8 (see 856). In process step 1686, a second anisotropic etch is performed. This is shown in FIG. 9 (see 954). In process step 1688, an oxide liner is deposited. This is shown in FIG. 10 (see 1058). In process step 1690, an oxide layer is deposited. This is shown in FIG. 11 (see 1160). In process step 1692, a planarization is performed. This is shown in FIG. 12 (see 1200). In process step 1694, a BHF deglaze is performed. This is shown in FIG. 13 (see 1300). In process step 1696, the pad nitride layer is removed (see 1346 of FIG. 13, which is removed in semiconductor structure 1400 of FIG. 14). This may be performed with a wet chemistry, or other suitable removal process. In process step 1698, the amorphous carbon layer is removed. The amorphous carbon removal process may be performed via an O2 (oxygen plasma) ashing process. The resulting semiconductor structure is shown in FIG. 14 (see 1400). The methods describe herein provide for a consistent step height in semiconductor devices. The step height is important in various semiconductor structures, such as the height of a transistor gate above the STI region, or the height of the STI region as compared with the pad oxide. The use of the amorphous carbon in these methods serves to provide an effective stopping layer for these processes.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a replacement metal transistor gate comprising;
   depositing a layer of amorphous carbon on a sacrificial gate disposed at a location on a semiconductor structure;
   depositing an oxide layer on the layer of amorphous carbon;
   depositing a nitride layer on the oxide layer;
   planarizing the semiconductor structure to expose the layer of amorphous carbon;
   removing the layer of amorphous carbon;
   removing the sacrificial gate; and
   forming a metal gate in the location previously occupied by the sacrificial gate.

2. The method of claim 1, further including planarizing the semiconductor structure with a chemical mechanical polish.

3. The method of claim 2, further including planarizing the semiconductor structure with a fixed abrasive chemical mechanical polish.

4. The method of claim 1, wherein depositing a layer of amorphous carbon on a sacrificial gate comprises depositing a layer of amorphous carbon having a thickness ranging from about 100 angstroms to about 300 angstroms.

5. The method of claim 1, further including depositing a layer of amorphous carbon with a chemical vapor deposition process.

* * * * *